(12) United States Patent
Song et al.

(10) Patent No.: US 10,431,668 B2
(45) Date of Patent: Oct. 1, 2019

(54) METHOD OF FABRICATING THIN FILM TRANSISTOR, THIN FILM TRANSISTOR, AND DISPLAY APPARATUS

(71) Applicant: BOE TECHNOLOGY GROUP CO., LTD., Beijing (CN)

(72) Inventors: Zhen Song, Beijing (CN); Wei Li, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 15 days.

(21) Appl. No.: 15/741,741

(22) PCT Filed: Jun. 30, 2017

(86) PCT No.: PCT/CN2017/091081
§ 371 (c)(1),
(2) Date: Jan. 3, 2018

(87) PCT Pub. No.: WO2018/099066
PCT Pub. Date: Jun. 7, 2018

(65) Prior Publication Data
US 2019/0081159 A1    Mar. 14, 2019

(30) Foreign Application Priority Data
Nov. 30, 2016    (CN) .......................... 2016 1 1082799

(51) Int. Cl.
*H01L 29/66*    (2006.01)
*H01L 29/417*    (2006.01)
(Continued)

(52) U.S. Cl.
CPC .... *H01L 29/66742* (2013.01); *H01L 21/0273* (2013.01); *H01L 29/1033* (2013.01);
(Continued)

(58) Field of Classification Search
CPC ........... H01L 29/66742; H01L 29/4908; H01L 29/66477; H01L 29/66757; H01L 29/786;
(Continued)

(56) References Cited

U.S. PATENT DOCUMENTS 6,278,130 B1 *    8/2001    Joo ........................ G02F 1/1368
257/59
8,759,186 B2    6/2014    Yeh et al.
(Continued)

FOREIGN PATENT DOCUMENTS

CN    102522337 A    6/2012
CN    103346089 A    10/2013
(Continued)

OTHER PUBLICATIONS

International Search Report & Written Opinion dated Oct. 11, 2017, regarding PCT/CN2017/091081.

*Primary Examiner* — Joseph C. Nicely
(74) *Attorney, Agent, or Firm* — Intellectual Valley Law, P.C.

(57) ABSTRACT

The present application discloses a method of fabricating a thin film transistor. The method includes forming an active layer having a channel region, a source electrode contact region, and a drain electrode contact region, on a base substrate; forming a first photoresist layer on a side of the active layer distal to the base substrate, the first photoresist layer is formed in a region outside that corresponding to the channel region; forming an insulating material layer on a side of the first photoresist layer distal to the base substrate; forming a first conductive metal material layer on a side of the insulating material layer distal to the first photoresist layer; and removing the first photoresist layer, the insulating
(Continued)

material layer, the first conductive metal material layer, in the region outside that corresponding to the channel region by a lift-off method.

16 Claims, 3 Drawing Sheets

(51) Int. Cl.
    *H01L 29/423*     (2006.01)
    *H01L 29/45*     (2006.01)
    *H01L 29/49*     (2006.01)
    *H01L 21/027*     (2006.01)
    *H01L 29/10*     (2006.01)
    *H01L 29/786*     (2006.01)

(52) U.S. Cl.
    CPC ...... *H01L 29/41733* (2013.01); *H01L 29/423* (2013.01); *H01L 29/42384* (2013.01); *H01L 29/45* (2013.01); *H01L 29/458* (2013.01); *H01L 29/4908* (2013.01); *H01L 29/66757* (2013.01); *H01L 29/66969* (2013.01); *H01L 29/78696* (2013.01)

(58) Field of Classification Search
    CPC ........... H01L 29/1033; H01L 29/42376; H01L 21/0273; H01L 29/78696; H01L 2029/42388
    See application file for complete search history.

(56) References Cited

U.S. PATENT DOCUMENTS

| | | | |
|---|---|---|---|
| 9,425,193 B2* | 8/2016 | Price | H01L 27/1288 |
| 2005/0287726 A1* | 12/2005 | Paik | H01L 21/2022 438/166 |
| 2009/0325341 A1* | 12/2009 | Itagaki | H01L 29/7869 438/104 |
| 2012/0018718 A1 | 1/2012 | Zan et al. | |
| 2013/0105765 A1* | 5/2013 | Haensch | H01L 29/42364 257/29 |
| 2013/0244374 A1* | 9/2013 | Okazaki | H01L 29/4908 438/104 |
| 2014/0048806 A1* | 2/2014 | Price | H01L 29/78618 257/57 |
| 2016/0336460 A1 | 11/2016 | Wang et al. | |
| 2017/0323904 A1* | 11/2017 | Kim | H01L 27/1214 |

FOREIGN PATENT DOCUMENTS

| | | |
|---|---|---|
| CN | 103730514 A | 4/2014 |
| CN | 106024608 A | 10/2016 |

* cited by examiner

METHOD OF FABRICATING THIN FILM TRANSISTOR, THIN FILM TRANSISTOR, AND DISPLAY APPARATUS

CROSS-REFERENCE TO RELATED APPLICATION

This application is a national stage application under 35 U.S.C. § 371 of International Application No. PCT/CN2017/091081, filed Jun. 30, 2017, which claims priority to Chinese Patent Application No. 201611082799.9, filed Nov. 30, 2016, the contents of which are incorporated by reference in the entirety.

TECHNICAL FIELD

The present invention relates to display technology, more particularly, to a method of fabricating a thin film transistor, a thin film transistor, and a display apparatus.

BACKGROUND

Display devices such as liquid crystal display (LCD) and organic light-emitting diode (OLED) have been widely used. LCD and OLED display devices use thin film transistor (TFT) to control pixels in the display panel. Examples of TFT include amorphous silicon TFT, polycrystalline silicon TFT, single crystal silicon TFT, and metal oxide TFT. A thin film transistor may be classified into a top gate type or a bottom gate type.

SUMMARY

In one aspect, the present invention provides a method of fabricating a thin film transistor, comprising forming an active layer having a channel region, a source electrode contact region, and a drain electrode contact region, on a base substrate; forming a first photoresist layer on a side of the active layer distal to the base substrate, the first photoresist layer is formed in a region outside that corresponding to the channel region; forming an insulating material layer on a side of the first photoresist layer distal to the base substrate; forming a first conductive metal material layer on a side of the insulating material layer distal to the first photoresist layer; and removing the first photoresist layer, the insulating material layer, the first conductive metal material layer, in the region outside that corresponding to the channel region by a lift-off method, a portion of the insulating material layer in a region corresponding to the channel region remains thereby forming a first gate insulating layer, a portion of the first conductive metal material layer in the region corresponding to the channel region remains thereby forming a gate electrode.

Optionally, the active layer, the first gate insulating layer, and the gate electrode are formed so that boundaries between the source electrode contact region and the channel region and between the drain electrode contact region and the channel region substantially align with edges of the first gate insulating layer and the gate electrode.

Optionally, the active layer, the first gate insulating layer, and the gate electrode are formed so that a projection of the gate electrode on the base substrate substantially overlaps with that of the channel region, the projection of the gate electrode on the base substrate and that of the channel region are substantially coextensive with each other.

Optionally, the method further comprises forming a second gate insulating layer between the channel region of the active layer and the first gate insulating layer, the second gate insulating layer is formed to be in contact with the channel region of the active layer; wherein the second gate insulating layer is formed to have a resistivity higher than that of the first gate insulating layer; a projection of the second gate insulating layer on the base substrate substantially overlaps with that of the channel region, the projection of the second gate insulating layer on the base substrate and that of the channel region are substantially coextensive with each other.

Optionally, the method further comprises forming a source electrode, a drain electrode, and the second gate insulating layer in a single process, the source electrode and the drain electrode are formed on a side of the active layer distal to the base substrate; wherein forming the source electrode, the drain electrode, and the second gate insulating layer comprises forming a second conductive metal material layer on a side of the active layer distal to the base substrate, the second conductive metal material layer is formed to comprises a first portion in a region corresponding to the source electrode contact region of the active layer, a second portion in a region corresponding to the drain electrode contact region of the active layer, and a third portion in a region corresponding to the channel region of the active layer; forming the first photoresist layer on a side of the second conductive metal material layer distal to the active layer, the first photoresist layer is formed in the region outside that corresponding to the channel region; and oxidizing the third portion of the second conductive metal material layer thereby forming the second gate insulating layer, the first portion remains substantially unoxidized thereby forming the source electrode, the second portion remains substantially unoxidized thereby forming the drain electrode.

Optionally, the active layer and the second conductive metal material layer are formed in a single patterning process; forming the active layer and the second conductive metal material layer comprises forming a semiconductor material layer on the base substrate; forming a third conductive metal material layer on a side of the semiconductor material layer distal to the base substrate; forming a second photoresist layer on a side of the third conductive metal material layer distal to the semiconductor material layer, the second photoresist layer is formed in a region corresponding to the active layer; removing a portion of the third conductive metal material layer outside a region corresponding to the second photoresist layer thereby forming the second conductive metal material layer; and removing a portion of the semiconductor material layer outside the region corresponding to the second photoresist layer thereby forming the active layer.

Optionally, oxidizing the third portion of the second conductive metal material layer is performed by anodic oxidation, annealing in an oxygen atmosphere, oxygen plasma treatment, or a combination thereof.

Optionally, the second conductive metal material layer is formed using hafnium, or tantalum, or a combination thereof.

Optionally, the second gate insulating layer is formed using $Hf_xO_y$, or $Ta_xO_y$, $Hf_xO_yN_z$, or $Ta_xO_yN_z$, or a combination thereof, x>0, y>0, z>0.

Optionally, the method further comprises etching the second gate insulating layer to reduce a thickness of the second gate insulating layer.

Optionally, the first gate insulating layer is formed using $Si_xO_y$, $Si_xN_y$, $Si_xO_yN_z$, or a combination thereof, x>0, y>0, z>0.

In another aspect, the present invention provides a thin film transistor comprising an active layer having a channel region, a source electrode contact region, and a drain electrode contact region on a base substrate; a first gate insulating layer on a side of the active layer distal to the base substrate; and a gate electrode on a side of the first gate insulating layer distal to the active layer wherein boundaries between the source electrode contact region and the channel region and between the drain electrode contact region and the channel region substantially align with edges of the first gate insulating layer and the gate electrode.

Optionally, a projection of the gate electrode on the base substrate substantially overlaps with that of the channel region, the projection of the gate electrode on the base substrate and that of the channel region are substantially coextensive with each other.

Optionally, the thin film transistor further comprises a second gate insulating layer between the channel region of the active layer and the first gate insulating layer, the second gate insulating layer is in contact with the channel region of the active layer; wherein the second gate insulating layer has a resistivity higher than that of the first gate insulating layer; and a projection of the second gate insulating layer on the base substrate substantially overlaps with that of the channel region, the projection of the second gate insulating layer on the base substrate and that of the channel region are substantially coextensive with each other.

Optionally, the thin film transistor further comprises a source electrode and a drain electrode made of a metal material comprising M1, M1 is a single metal or a combination of metals; wherein the second gate insulating layer is made of a material comprising $M1O_mN_n$, $m>0$, $n\geq 0$; the source electrode, the drain electrode, and the second gate insulating layer are in a same layer.

Optionally, M1 comprises hafnium, or tantalum, or a combination thereof; and $M1O_mN_n$ comprises $Hf_xO_y$, or $Ta_xO_y$, $Hf_xO_yN_z$, or $Ta_xO_yN_z$, or a combination thereof.

Optionally, the source electrode and the drain electrode are on a side of the active layer distal to the base substrate.

Optionally, a projection of the gate electrode on the base substrate substantially overlaps with that of the channel region, the first gate insulating layer, and the second gate insulating layer; and the projection of the gate electrode on the base substrate and those of the channel region, the first gate insulating layer, and the second gate insulating layer are substantially coextensive with each other.

Optionally, a height of a surface of the second gate insulating layer distal to the base substrate relative to a surface of the base substrate is less than a height of a surface of the source electrode and the drain electrode distal to the base substrate relative to the surface of the base substrate.

In another aspect, the present invention provides a display apparatus comprising the thin film transistor described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The conventional top-gate type thin film transistors have relatively small parasitic capacitance, thus a pixel circuit having a top-gate type thin film transistor has a higher on/off speed. However, there are several problems associated with the conventional top-gate type thin film transistors. In conventional top-gate type thin film transistors, the gate electrode is formed by a wet etching process. Due to the critical dimension bias during the wet etching process, the gate electrode is typically formed to be smaller than the channel region of the thin film transistor, resulting in offset regions on two sides of the channel region of the active layer. The existence of offset regions in the conventional top-gate type thin film transistor results in a higher on/off current ratio and a decreased current during the "on" period of the thin film transistor because the offset regions is in direct contact with and adjacent to the source electrode contact region. Moreover, the existence of offset regions in the conventional top-gate type thin film transistor leads to an increased parasitic resistance in the source terminal and the drain terminal. Further, the existence of offset regions in the conventional top-gate type thin film transistor leads to an increased ohmic contact resistance between the source electrode and the active layer and between the drain electrode and the active layer. To decrease the ohmic contact resistance, the active layer is typically conductorized using high-power helium or hydrogen plasma. However, the active layer conductorization often is not effective in decreasing the ohmic contact resistance.

Figure 1:
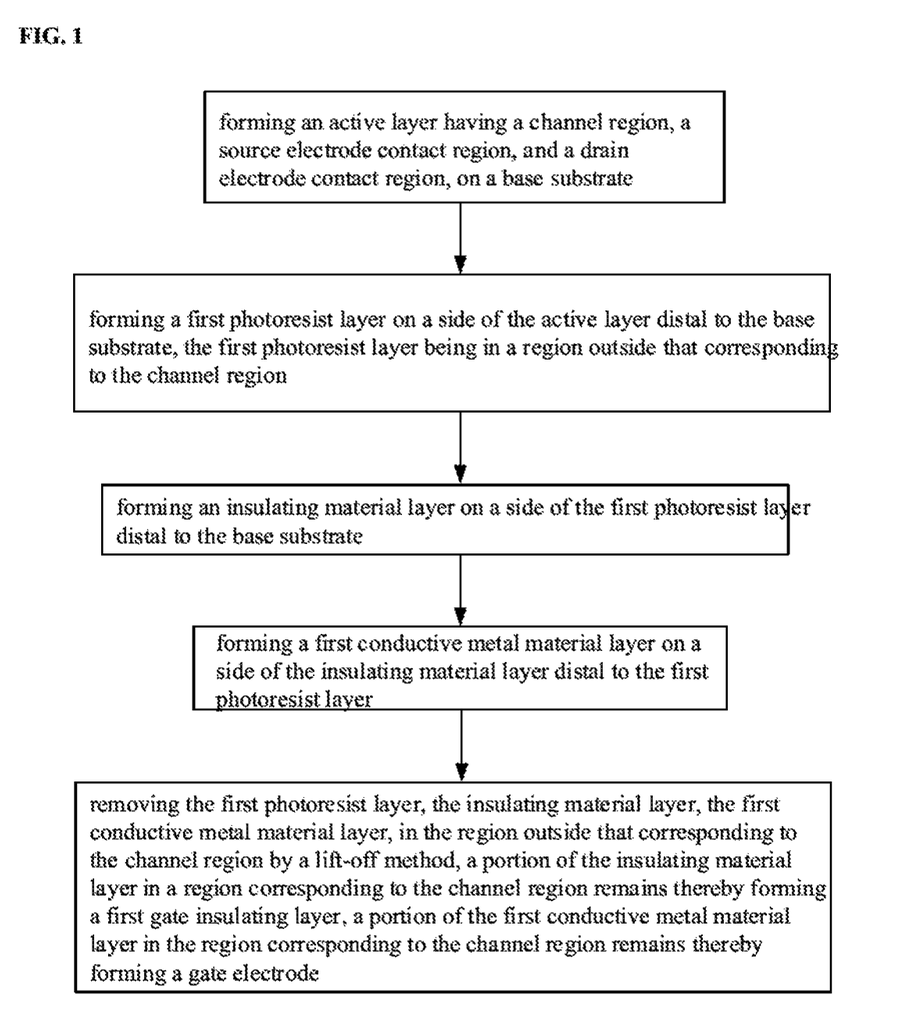
FIG. 1 is a flow chart illustrating a method of fabricating a thin film transistor in some embodiments according to the present disclosure.

Accordingly, the present disclosure provides, inter alia, a method of fabricating a thin film transistor, a thin film transistor, and a display apparatus that substantially obviate one or more of the problems due to limitations and disadvantages of the related art. In one aspect, the present disclosure provides a method of fabricating a thin film transistor. FIG. 1 is a flow chart illustrating a method of fabricating a thin film transistor in some embodiments according to the present disclosure. Referring to FIG. 1, the method in some embodiments includes forming an active layer having a channel region, a source electrode contact region, and a drain electrode contact region, on a base substrate; forming a first photoresist layer on a side of the active layer distal to the base substrate, the first photoresist layer being in a region outside that corresponding to the channel region; forming an insulating material layer on a side of the first photoresist layer distal to the base substrate; forming a first conductive metal material layer on a side of the insulating material layer distal to the first photoresist layer; and removing the first photoresist layer, the insulating material layer, the first conductive metal material layer, in the region outside that corresponding to the channel region by a lift-off method, a portion of the insulating material layer in a region corresponding to the channel region remains thereby forming a first gate insulating layer, a portion of the first conductive metal material layer in the region corresponding to the channel region remains thereby forming a gate electrode. Optionally, the method further includes forming a source electrode and a drain electrode. Optionally, the source electrode and the drain electrode are formed on a side of the active layer distal to the base substrate. Optionally, the source electrode and the drain electrode are formed on a side of the active layer proximal to the base substrate. Optionally, the first photoresist layer is formed on a side of the active layer, the source electrode, and the drain electrode distal to the base substrate.

In the present method, the first photoresist layer is formed in the region outside that corresponding to the channel region, e.g., exposing a region corresponding to the channel region of the active layer. The first photoresist layer is formed in a region corresponding to the source electrode contact region and the drain electrode contact region. Boundaries between the source electrode contact region and the channel region and between the drain electrode contact region and the channel region substantially align with edges of the first photoresist layer. Subsequently, the insulating material layer and the first conductive metal material layer are sequentially formed on a side of the active layer and the first photoresist layer distal to the base substrate. By lifting off the first photoresist layer, the insulating material layer, the first conductive metal material layer, in the region outside that corresponding to the channel region, the portion of the insulating material layer and the portion of the first conductive metal material layer in the region corresponding to the channel region remain. The remaining portion of the insulating material layer in the region corresponding to the channel region forms the first gate insulating layer. The remaining portion of the first conductive metal material layer in the region corresponding to the channel region forms the gate electrode. The gate electrode formed according to the present method self-aligns with the boundaries between the source electrode contact region and the channel region and between the drain electrode contact region and the channel region substantially, e.g., the gate electrode self-aligns with the source electrode and the drain electrode, achieving high placement accuracy. Accordingly, the present thin film transistor is substantially free of any offset regions in the active layer, which is observed in the conventional thin film transistor having a gate electrode formed by wet-etching. Thus, the present thin film transistor substantially obviates the parasitic resistance introduced by the offset regions. Moreover, the gate electrode and the first gate insulating layer are formed in a single patterning process, greatly simplifying the fabrication process. Moreover, in the present thin film transistor, the source electrode and the drain electrode abut the channel region, achieving greatly improved electrical characteristics of the thin film transistor. For example, the total resistance between the source electrode and the drain electrode can be minimized as compared to that in the conventional thin film transistors (e.g., by conductorizing the active layer), thus obviating additional fabrication step such as the active layer conductorization step. The selection of the source electrode material and the drain electrode material is not strictly limited by the ohmic contact resistance between the electrode and the active layer, further lowering the fabrication costs.

Optionally, the active layer, the first gate insulating layer, and the gate electrode are formed so that boundaries between the source electrode contact region and the channel region and between the drain electrode contact region and the channel region substantially align with edges of the first gate insulating layer and the gate electrode. Optionally, the active layer, the first gate insulating layer, and the gate electrode are formed so that a projection of the gate electrode on the base substrate substantially overlaps with that of the channel region, the projection of the gate electrode on the base substrate and that of the channel region are substantially coextensive with each other.

Various appropriate semiconductor materials and various appropriate fabricating methods may be used to make the active layer. For example, a semiconductor material may be deposited on the substrate by a plasma-enhanced chemical vapor deposition (PECVD) process. Examples of appropriate semiconductor materials for making the active layer includes, but are not limited to, metal oxides (e.g., IGZO, ITO, IZTO, IGTO, AZO), amorphous silicon, polycrystalline silicon, etc.

In some embodiments, the method further includes forming a second gate insulating layer between the channel region of the active layer and the first gate insulating layer. The second gate insulating layer is formed to be in contact with the channel region of the active layer. Optionally, the second gate insulating layer is formed to have a resistivity higher than that of the first gate insulating layer. Optionally, a projection of the second gate insulating layer on the base substrate substantially overlaps with that of the channel region, the projection of the second gate insulating layer on the base substrate and that of the channel region are substantially coextensive with each other.

By having a first gate insulating layer and a second insulating layer having different resistivities in the thin film transistor, and having the second gate insulating layer in contact with the channel region of the active layer, the electrical characteristics of the thin film transistor are significantly enhanced.

Various appropriate insulating materials and various appropriate fabricating methods may be used to make the first gate insulating layer. For example, an insulating material may be deposited on the substrate by a plasma-enhanced chemical vapor deposition (PECVD) process. The first gate insulating layer may be made using a material that is highly oxygen-resistant and moist-resistant. Examples of appropriate insulating materials for making the first gate insulating layer include, but are not limited to, $Si_xO_y$, $Si_xN_y$, $Si_xO_yN_z$, or a combination thereof.

Various appropriate insulating materials and various appropriate fabricating methods may be used to make the second gate insulating layer. For example, the second gate insulating layer may be formed by oxidizing a metal material thereby forming a metal oxide insulating layer. Optionally, the oxidation of the metal material may be performed by anodic oxidization, annealing in an oxygen atmosphere, oxygen plasma treatment, or a combination thereof. Examples of appropriate insulating materials for making the second gate insulating layer include, but are not limited to, a metal oxide having a high dielectric constant. For example, the second gate insulating layer may be formed using $Hf_xO_y$, $Ta_xO_y$, or a combination thereof, x>0, y>0. These metal oxides have a dielectric constant higher than 3.9. The second gate insulating layer made using these metal oxides has a high resistivity. Other metal oxides with high dielectric constant include $Zr_xO_y$, $Al_xO_y$, $La_xO_y$, $Y_xO_y$, $Ce_xO_y$, and $Ti_xO_y$. Optionally, the second gate insulating layer may be formed by oxynitriding a metal material thereby forming a metal oxynitride insulating layer. Optionally, the oxynitridation of the metal material may be performed by, e.g., annealing in an oxygen-nitrogen mixed atmosphere, plasma treatment in an oxygen-nitrogen mixed atmosphere, or a combination thereof. Examples of appropriate insulating materials for making the second gate insulating layer include, but are not limited to, a metal oxynitride having a high dielectric constant. For example, the second gate insulating layer may be formed using $Hf_xO_yN_z$, $Ta_xO_yN_z$, or a combination thereof, x>0, y>0, z>0. Other metal oxynitrides with high dielectric constant include $Zr_xO_yN_z$, $Al_xO_yN_z$, $La_xO_yN_z$, $Y_xO_yN_z$, $Ce_xO_yN_z$, and $Ti_xO_yN_z$.

In some embodiments, the method further includes forming a source electrode and a drain electrode. Optionally, the source electrode, the drain electrode, and the second gate insulating layer are formed in a single process. Optionally, the source electrode and the drain electrode are formed on a side of the active layer distal to the base substrate. Optionally, the step of forming the source electrode, the drain electrode, and the second gate insulating layer includes forming a second conductive metal material layer on a side of the active layer distal to the base substrate, the second conductive metal material layer is formed to include a first portion in a region corresponding to the source electrode contact region of the active layer, a second portion in a region corresponding to the drain electrode contact region of the active layer, and a third portion in a region corresponding to the channel region of the active layer; forming the first photoresist layer on a side of the second conductive metal material layer distal to the active layer, the first photoresist layer is formed in the region outside that corresponding to the channel region; and oxidizing the third portion of the second conductive metal material layer thereby forming the second gate insulating layer, the first portion remains substantially unoxidized thereby forming the source electrode, the second portion remains substantially unoxidized thereby forming the drain electrode.

Optionally, the second conductive metal material layer includes a metal material. Examples of appropriate metal materials for making the second conductive metal material layer include a metal or an alloy, when oxidized or oxynitridized, whose oxides or oxynitrides have a high dielectric constant, e.g., greater than 3.9. Optionally, the second conductive metal material layer includes hafnium, tantalum, or a combination thereof.

Optionally, the step of oxidizing the third portion of the second conductive metal material layer is performed by anodic oxidization, annealing in an oxygen atmosphere, oxygen plasma treatment, or a combination thereof. Optionally, the second gate insulating layer has a thickness in a range of approximately 30 nm to approximately 40 nm.

In some embodiments, the active layer and the second conductive metal material layer are formed in a single patterning process. As used herein, the term "patterning" generally refers to processes of making a pattern. Optionally, a patterning process typically includes photoresist coating, exposing, developing, etching and photoresist peeling. Optionally, the step of forming the active layer and the second conductive metal material layer includes forming a semiconductor material layer on the base substrate; forming a third conductive metal material layer on a side of the semiconductor material layer distal to the base substrate; forming a second photoresist layer on a side of the third conductive metal material layer distal to the semiconductor material layer, the second photoresist layer being in a region corresponding to the active layer; removing a portion of the third conductive metal material layer outside a region corresponding to the second photoresist layer thereby forming the second conductive metal material layer; and removing a portion of the semiconductor material layer outside the region corresponding to the second photoresist layer thereby forming the active layer.

By forming the active layer and the second conductive metal material layer in a single patterning process, the active layer and the second conductive metal material layer have a same pattern, e.g., a projection of the second conductive metal material layer on the base substrate substantially overlaps with that of the active layer, the projection of the second conductive metal material layer on the base substrate and that of the active layer are substantially coextensive with each other. Subsequently, the third portion of the second conductive metal material layer is oxidized to form the second gate insulating layer, as discussed above.

In some embodiments, the second gate insulating layer is formed in a process separate from that for the source electrode and the drain electrode. Optionally, the step of forming the second gate insulating layer includes providing a metal oxide material or a metal oxynitride material, and forming the second gate insulating layer using the metal oxide material or a metal oxynitride material by, e.g., vapor deposition. Optionally, the second gate insulating layer is formed to be in contact with the channel region of the active layer. Optionally, the second gate insulating layer is formed using a metal oxide or a metal oxynitride material having a high dielectric constant, e.g., greater than 3.9. For example, the second gate insulating layer may be formed using $Hf_xO_y$, $Ta_xO_y$, $Hf_xO_yN_z$, $Ta_xO_yN_z$, or a combination thereof, x>0, y>0, z>0.

In some embodiments, the method further includes adjusting a thickness of the second gate insulating layer. Optionally, the step of adjusting the thickness of the second gate insulating layer includes etching the second gate insulating layer to reduce a thickness of the second gate insulating layer. By reducing the thickness of the second gate insulating layer, the threshold voltage $V_T$ of the thin film transistor can be controlled to be substantially equal to zero, further enhancing electrical characteristics of the thin film transistor.

Figure 2:
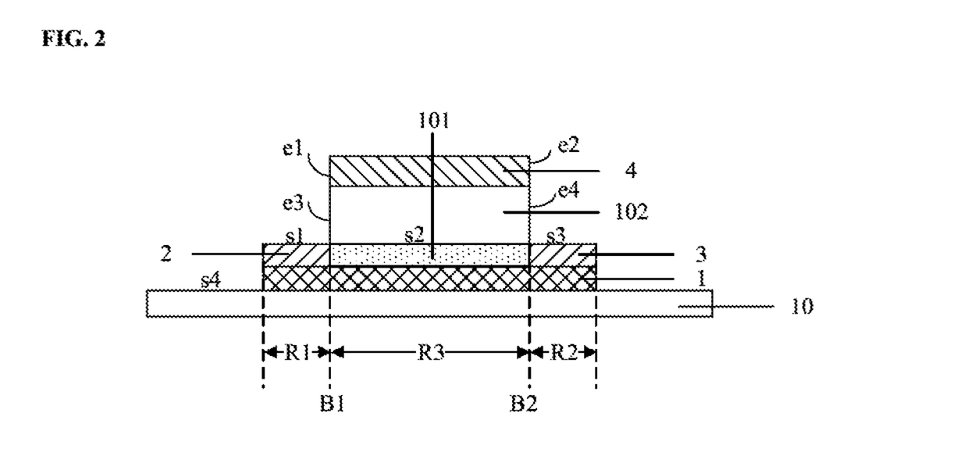
FIG. 2 is a schematic diagram illustrating the structure of a thin film transistor in some embodiments according to the present disclosure.
Figure 3:
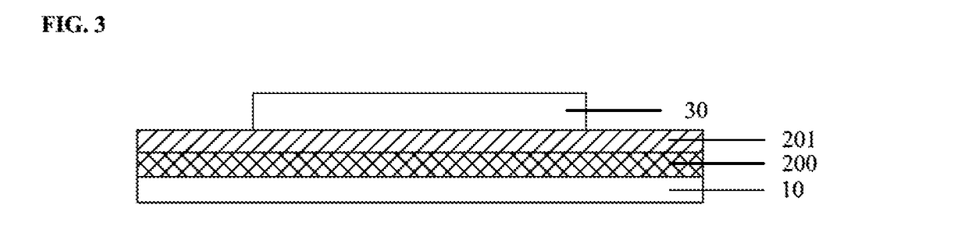
FIGS. 3 to 7 illustrates a process of fabricating a thin film transistor in some embodiments according to the present disclosure.

FIG. 2 is a schematic diagram illustrating the structure of a thin film transistor in some embodiments according to the present disclosure. FIGS. 3 to 7 illustrates a process of fabricating a thin film transistor in some embodiments according to the present disclosure. Referring to FIG. 3, the fabrication process in some embodiments includes forming a semiconductor material layer 200 on the base substrate 10, forming a third conductive metal material layer 201 on a side of the semiconductor material layer 200 distal to the base substrate 10, and forming a second photoresist layer 30 on a side of the third conductive metal material layer 201 distal to the semiconductor material layer 200. The second photoresist layer 30 is formed in a region corresponding to the active layer. In one example, the step of forming the second photoresist layer 30 includes forming a photoresist material layer on a side of the third conductive metal material layer 201 distal to the semiconductor material layer 200, exposing the photoresist material layer using a mask plate having a pattern corresponding to the active layer, and developing the exposed photoresist material layer. The exposed portion of the photoresist material layer (which is outside the region corresponding to the active layer) is removed, the unexposed portion of the photoresist material layer remains, thereby forming the second photoresist layer 30.

Figure 4:
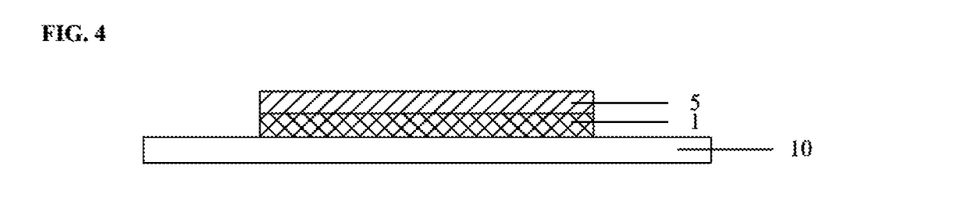

Referring to FIG. 3 and FIG. 4, a portion of the third conductive metal material layer 201 outside a region corresponding to the second photoresist layer 30 is removed thereby forming a second conductive metal material layer 5, and a portion of the semiconductor material layer 200 outside the region corresponding to the second photoresist layer 30 is removed thereby forming the active layer 1.

Optionally, the second conductive metal material layer 5 is made of a first metal such as hafnium, tantalum, or a combination thereof. An oxidized first metal, e.g., $Hf_xO_y$, $Ta_xO_y$, or a combination thereof, has a relatively high dielectric constant and a relatively high resistivity.

Figure 5:
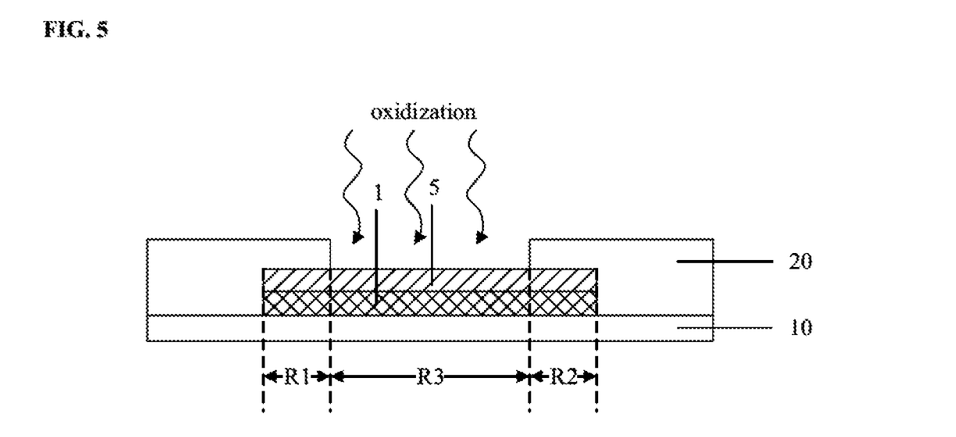

Referring to FIG. 5, the process in some embodiments further includes forming a first photoresist layer 20 on a side of the second conductive metal material layer 5 and the active layer 1 distal to the base substrate 10. The first photoresist layer 20 is formed in a region outside that corresponding to the channel region R3, e.g., in a region corresponding to at least the source electrode contact region R1 and the drain electrode contact region R2. In one example, the step of forming the first photoresist layer 20 includes forming a photoresist material layer on a side of the second conductive metal material layer 5 and the active layer 1 distal to the base substrate 10, exposing the photoresist material layer using a mask plate having a pattern corresponding to the channel region R3 of the active layer 1, and developing the exposed photoresist material layer. The exposed portion of the photoresist material layer (which corresponding to the channel region R3 of the active layer 1) is removed, the unexposed portion of the photoresist material layer remains, thereby forming the first photoresist layer 20.

Figure 6:
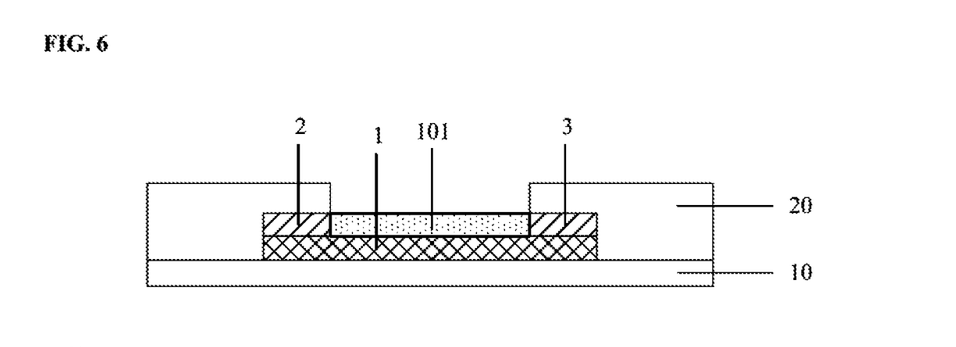

As shown in FIG. 5, the second conductive metal material layer 5 includes a first portion in a region corresponding to the source electrode contact region R1 of the active layer 1, a second portion in a region corresponding to the drain electrode contact region R2 of the active layer 1, and a third portion in a region corresponding to the channel region R3 of the active layer 1. The first portion and the second portion of the second conductive metal material layer 5 are covered by the first photoresist layer 20, and the third portion of the second conductive metal material layer 5 is exposed. The third portion of the second conductive metal material layer 5 is then oxidized thereby forming the second gate insulating layer 101, as shown in FIG. 6. The first portion of the second conductive metal material layer 5 remains substantially unoxidized thereby forming the source electrode 2, the second portion of the second conductive metal material layer 5 remains substantially unoxidized thereby forming the drain electrode 3, as shown in FIG. 6. The source electrode 2, the drain electrode 3, and the second gate insulating layer 101 constitute an integral structure.

Figure 7:
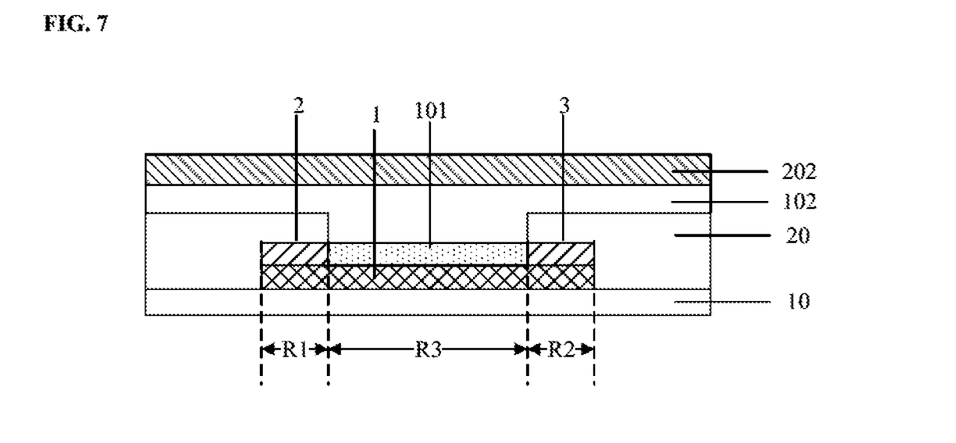

Referring to FIG. 7, the process in some embodiments further includes forming an insulating material layer 102 on a side of the first photoresist layer 20 distal to the base substrate 10; and forming a first conductive metal material layer 202 on a side of the insulating material layer 102 distal to the first photoresist layer 20. Subsequently, the first photoresist layer 20, the insulating material layer 102, the first conductive metal material layer 202, in the region outside that corresponding to the channel region R3 are removed by a lift-off method. After the lift-off a portion of the insulating material layer 102 in a region corresponding to the channel region R3 remains thereby forming a first gate insulating layer 102, a portion of the first conductive metal material layer 202 in the region corresponding to the channel region R3 remains thereby forming a gate electrode 4, as shown in FIG. 2.

Various alternative implementations may be practiced according to the present disclosure. For example, the active layer 1 and the second conductive metal material layer 5 in FIG. 4 may be formed by a different patterning process, e.g., the active layer 1 and the second conductive metal material layer 5 may be formed in two separate patterning processes. In another example, the second gate insulating layer 101 in FIG. 6 may be formed by directly depositing a metal oxide material or a metal oxynitride material on the substrate, instead of oxidizing or oxynitridizing the third portion of the second conductive metal material layer 5.

In another example, the active layer is formed on a side of the source electrode and the drain electrode distal to the base substrate. Subsequently, a second gate insulating layer is formed in a region corresponding to the channel region of the active layer, the second gate insulating layer is formed to be in contact with the channel region of the active layer. A first gate insulating layer is then formed on a side of the second gate insulating layer distal to the active layer. The second gate insulating layer has a resistivity higher than that of the first gate insulating layer. Optionally, the second gate insulating layer is made of a material having a relatively high dielectric constant, e.g., greater than 3.9. Optionally, the second gate insulating layer includes $Hf_xO_y$, $Ta_xO_y$, or a combination thereof. Optionally, the first gate insulating layer includes $Si_xO_y$, $Si_xN_y$, $Si_xO_yN_z$, or a combination thereof.

In some embodiments, the method includes forming a source electrode and a drain electrode on a base substrate; forming an active layer having a channel region, a source electrode contact region, and a drain electrode contact region on a side of the source electrode and the drain electrode distal to the base substrate; forming a first photoresist layer on a side of the active layer distal to the base substrate, the first photoresist layer is formed in a region outside that corresponding to the channel region; sequentially forming a second insulating material layer, a first insulating material layer, and a first conductive metal material layer on a side of the first photoresist layer and the active layer distal to the base substrate; and removing the first photoresist layer, the second insulating material layer, the first insulating material layer, and the first conductive metal material layer in the region outside that corresponding to the channel region by a lift-off method. A portion of the second insulating material layer in a region corresponding to the channel region remains thereby forming a second gate insulating layer. A portion of the first insulating material layer in a region corresponding to the channel region remains thereby forming a first gate insulating layer. A portion of the first conductive metal material layer in the region corresponding to the channel region remains thereby forming a gate electrode.

In another aspect, the present disclosure provides a thin film transistor fabricated by the method described herein.

In another aspect, the present disclosure provides a thin film transistor. Referring to FIG. 2, the thin film transistor in some embodiments includes a base substrate 10; an active layer 1 having a channel region R3, a source electrode contact region R1, and a drain electrode contact region R2 on the base substrate 10; a first gate insulating layer 102 on a side of the active layer 1 distal to the base substrate 10; and a gate electrode 4 on a side of the first gate insulating layer 102 distal to the active layer 1. Optionally, the boundary B1 between the source electrode contact region R1 and the channel region R3 and the boundary B2 between the drain electrode contact region R2 and the channel region R3 substantially align with edges of the first gate insulating layer 102 and the gate electrode 4. As shown in FIG. 2, the first gate insulating layer 102 has a first edge e3 and a second edge e4, and the gate electrode 4 has a first edge e1 and a second edge e2. As shown in FIG. 2, the first edge e1 of the gate electrode 4 and the first edge e3 of the first gate insulating layer 102 align with the boundary B1 between the source electrode contact region R1 and the channel region R3, the second edge e2 of the gate electrode 4 and the second edge e4 of the first gate insulating layer 102 align with the boundary B2 between the drain electrode contact region R2 and the channel region R3. Due to the use of the lift-off method, the gate electrode 4 and the first gate insulating layer 102 have a substantially the same pattern, e.g., a same pattern as that of the channel region R3 of the active layer 1.

As shown in FIG. 2, a projection of the gate electrode 4 on the base substrate 10 substantially overlaps with that of the channel region R3, the projection of the gate electrode 4 on the base substrate 10 and that of the channel region R3 are substantially coextensive with each other. Similarly, a projection of the first gate insulating layer 102 on the base substrate 10 substantially overlaps with that of the channel region R3, the projection of the first gate insulating layer 102 on the base substrate 10 and that of the channel region R3 are substantially coextensive with each other.

In some embodiments, the thin film transistor further includes a second gate insulating layer 101 between the channel region R3 of the active layer 1 and the first gate insulating layer 102, the second gate insulating layer 101 is in contact with the channel region R3 of the active layer 1. The second gate insulating layer 101 has a resistivity higher than that of the first gate insulating layer 102. As shown in FIG. 2, boundaries between the source electrode contact region R1 and the channel region R3 and between the drain electrode contact region R2 and the channel region R3 substantially align with edges of the second gate insulating layer 101. A projection of the second gate insulating layer 101 on the base substrate 10 substantially overlaps with that of the channel region R3, and the projection of the second gate insulating layer 101 on the base substrate 10 and that of the channel region R3 are substantially coextensive with each other.

In the present thin film transistor, the gate electrode substantially aligns with the boundaries between the source electrode contact region and the channel region and between the drain electrode contact region and the channel region substantially, e.g., the gate electrode self-aligns with the source electrode and the drain electrode, achieving high placement accuracy. Accordingly, the present thin film transistor is substantially free of any offset regions in the active layer, which is observed in the conventional thin film transistor having a gate electrode formed by wet-etching. Thus, the present thin film transistor substantially obviates the parasitic resistance introduced by the offset regions. Moreover, in the present thin film transistor, the source electrode and the drain electrode abut the channel region, achieving greatly improved electrical characteristics of the thin film transistor. For example, the total resistance between the source electrode and the drain electrode can be minimized as compared to that in the conventional thin film transistors (e.g., by conductorizing the active layer), thus obviating additional fabrication step such as the active layer conductorization step. The selection of the source electrode material and the drain electrode material is not strictly limited by the ohmic contact resistance between the electrode and the active layer, further lowering the fabrication costs.

In some embodiments, the thin film transistor further includes a source electrode 2 and a drain electrode 3. Optionally, the source electrode 2 and the drain electrode 3 are made of a metal material comprising M1, M1 is a single metal or a combination of metals. Optionally, the second gate insulating layer is made of a material comprising $M1O_mN_n$, $m>0$, $n \geq 0$. In some embodiments, the source electrode 2, the drain electrode 3, and the second gate insulating layer 101 are in a same layer. Optionally, the source electrode 2, the drain electrode 3, and the second gate insulating layer 101 constitute an integral structure. As used herein, the term "same layer" refers to the relationship between the layers simultaneously formed in the same step. In one example, the source electrode 2, the drain electrode 3, and the second gate insulating layer 101 are in a same layer when they are formed as a result of one or more steps of a same patterning process performed in a same layer of material. In another example, the source electrode 2, the drain electrode 3, and the second gate insulating layer 101 can be formed in a same layer by simultaneously performing the step of forming the second gate insulating layer 101 and the step of forming the source electrode 2 and the drain electrode 3. The term "same layer" does not always mean that the thickness of the layer or the height of the layer in a cross-sectional view is the same.

Optionally, the $M1O_mN_n$ includes a metal oxide or a metal oxynitride having a high dielectric constant, e.g., greater than 3.9, and the M1 includes a metal or an alloy, oxide or oxynitride of which has a high dielectric constant, e.g., greater than 3.9. Optionally, the M1 includes hafnium, tantalum, or a combination thereof; and $M1O_mN_n$ includes $Hf_xO_y$, $Ta_xO_y$, $Hf_xO_yN_z$, $Ta_xO_yN_z$, or a combination thereof.

The first gate insulating layer 102 is not in direct contact with the active layer 1. Thus, whether or not the insulating material for the first gate insulating layer 102 will introduce hydrogen is not much of a concern, as the first insulating layer 102 is isolated from the active layer 1 by the second gate insulating layer 101. Optionally, the first gate insulating layer 102 includes a highly oxygen-resistant and moist-resistant insulating material. Optionally, the first gate insulating layer includes $Si_xO_y$, or $Si_xN_y$, or $Si_xO_yN_z$, or a combination thereof, $x>0$, $y>0$.

Referring to FIG. 2, the source electrode 2 and the drain electrode 3 in some embodiments are on a side of the active layer 1 distal to the base substrate 10. Optionally, the active layer 1 is on a side of the source electrode 2 and the drain electrode 3 distal to the base substrate 10.

Optionally, a projection of the gate electrode 4 on the base substrate 10 substantially overlaps with that of the channel region R3, the first gate insulating layer 102, and the second gate insulating layer 101. Optionally, the projection of the gate electrode 4 on the base substrate 10 and those of the channel region R3, the first gate insulating layer 102, and the second gate insulating layer 101 are substantially coextensive with each other.

In some embodiments, the second gate insulating layer 101 has a thickness substantially the same as those of the source electrode 2 and the drain electrode 3. Optionally, a height of a surface s2 of the second gate insulating layer 101 distal to the base substrate 10 relative to a surface 94 of the base substrate 10 is substantially the same as a height of a surface s1 of the source electrode and a surface s3 of the drain electrode distal to the base substrate 10 relative to the surface s4 of the base substrate 10.

In some embodiments, the second gate insulating layer 101 has a thickness different from (e.g., less than) those of the source electrode 2 and the drain electrode 3. Optionally, a height of a surface s2 of the second gate insulating layer 101 distal to the base substrate 10 relative to a surface s4 of the base substrate 10 is less than a height of a surface s of the source electrode 2 and the surface s3 of the drain electrode 3 distal to the base substrate 10 relative to the surface s4 of the base substrate 10. By reducing the thickness of the second gate insulating layer 101, the threshold voltage $V_T$ of the thin film transistor can be controlled to be substantially equal to zero, further enhancing electrical characteristics of the thin film transistor.

In another aspect, the present disclosure provides an array substrate having a thin film transistor described herein or fabricated by a method described herein.

In another aspect, the present disclosure provides a display panel having a thin film transistor described herein or fabricated by a method described herein.

In another aspect, the present disclosure provides a display apparatus having a thin film transistor described herein or fabricated by a method described herein. Examples of appropriate display apparatuses includes, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a thin film transistor, comprising:
    forming an active layer having a channel region, a source electrode contact region, and a drain electrode contact region, on a base substrate;
    forming a first photoresist layer on a side of the active layer distal to the base substrate, the first photoresist layer is formed in a region outside that corresponding to the channel region;
    forming an insulating material layer on a side of the first photoresist layer distal to the base substrate;
    forming a first conductive metal material layer on a side of the insulating material layer distal to the first photoresist layer;
    removing the first photoresist layer, the insulating material layer, the first conductive metal material layer, in the region outside that corresponding to the channel region by a lift-off method, a portion of the insulating material layer in a region corresponding to the channel region remains thereby forming a first gate insulating layer, a portion of the first conductive metal material layer in the region corresponding to the channel region remains thereby forming a gate electrode;
    forming a second gate insulating layer between the channel region of the active layer and the first gate insulating layer, the second gate insulating layer is formed to be in contact with the channel region of the active layer; and
    forming a source electrode, a drain electrode, and the second gate insulating layer in a single process, the source electrode and the drain electrode are formed on a side of the active layer distal to the base substrate;
    wherein the second gate insulating layer is formed to have a resistivity higher than that of the first gate insulating layer; and
    a projection of the second gate insulating layer on the base substrate substantially overlaps with that of the channel region, the projection of the second gate insulating layer on the base substrate and that of the channel region are substantially coextensive with each other;
    wherein forming the source electrode, the drain electrode, and the second gate insulating layer comprises:
    forming a second conductive metal material layer on a side of the active layer distal to the base substrate, the second conductive metal material layer is formed to comprise a first portion in a region corresponding to the source electrode contact region of the active layer, a second portion in a region corresponding to the drain electrode contact region of the active layer, and a third portion in a region corresponding to the channel region of the active layer;
    forming the first photoresist layer on a side of the second conductive metal material layer distal to the active layer, the first photoresist layer is formed in the region outside that corresponding to the channel region; and
    oxidizing the third portion of the second conductive metal material layer thereby forming the second gate insulating layer, the first portion remains substantially unoxidized thereby forming the source electrode, the second portion remains substantially unoxidized thereby forming the drain electrode.

2. The method of claim 1, wherein the active layer, the first gate insulating layer, and the gate electrode are formed so that boundaries between the source electrode contact region and the channel region and between the drain electrode contact region and the channel region substantially align with edges of the first gate insulating layer and the gate electrode.

3. The method of claim 1, wherein the active layer, the first gate insulating layer, and the gate electrode are formed so that a projection of the gate electrode on the base substrate substantially overlaps with that of the channel region, the projection of the gate electrode on the base substrate and that of the channel region are substantially coextensive with each other.

4. The method of claim 1, wherein the active layer and the second conductive metal material layer are formed in a single patterning process;
    forming the active layer and the second conductive metal material layer comprises:

forming a semiconductor material layer on the base substrate;

forming a third conductive metal material layer on a side of the semiconductor material layer distal to the base substrate;

forming a second photoresist layer on a side of the third conductive metal material layer distal to the semiconductor material layer, the second photoresist layer is formed in a region corresponding to the active layer;

removing a portion of the third conductive metal material layer outside a region corresponding to the second photoresist layer thereby forming the second conductive metal material layer; and removing a portion of the semiconductor material layer outside the region corresponding to the second photoresist layer thereby forming the active layer.

5. The method of claim 1, wherein oxidizing the third portion of the second conductive metal material layer is performed by anodic oxidation, annealing in an oxygen atmosphere, oxygen plasma treatment, or a combination thereof.

6. The method of claim 1, wherein the second conductive metal material layer is formed using hafnium, or tantalum, or a combination thereof.

7. The method of claim 1, wherein the second gate insulating layer is formed using $Hf_xO_y$, or $Ta_xO_y$, $Hf_xO_yN_z$, or $Ta_xO_yN_z$, or a combination thereof, $x>0$, $y>0$, $z>0$.

8. The method of claim 1, further comprising etching the second gate insulating layer to reduce a thickness of the second gate insulating layer.

9. The method of claim 1, wherein the first gate insulating layer is formed using $Si_xO_y$, $Si_xN_y$, $Si_xO_yN_z$, or a combination thereof, $x>0$, $y>0$, $z>0$.

10. A thin film transistor, comprising:

an active layer having a channel region, a source electrode contact region, and a drain electrode contact region on a base substrate;

a first gate insulating layer on a side of the active layer distal to the base substrate;

a gate electrode on a side of the first gate insulating layer distal to the active layer;

wherein boundaries between the source electrode contact region and the channel region and between the drain electrode contact region and the channel region substantially align with edges of the first gate insulating layer and the gate electrode a second gate insulating layer between the channel region of the active layer and the first gate insulating layer, the second gate insulating layer is in contact with the channel region of the active layer; and a source electrode and a drain electrode made of a metal material comprising M1, M1 is a single metal or a combination of metals;

wherein the second gate insulating layer has a resistivity higher than that of the first gate insulating layer;

a projection of the second gate insulating layer on the base substrate substantially overlaps with that of the channel region, the projection of the second gate insulating layer on the base substrate and that of the channel region are substantially coextensive with each other;

the second gate insulating layer is made of a material comprising $M1O_mN_n$, $m>0$, $n≥0$; and the source electrode, the drain electrode, and the second gate insulating layer are in a same layer.

11. The thin film transistor of claim 10, wherein a projection of the gate electrode on the base substrate substantially overlaps with that of the channel region, the projection of the gate electrode on the base substrate and that of the channel region are substantially coextensive with each other.

12. The thin film transistor of claim 10, wherein M1 comprises hafnium, or tantalum, or a combination thereof; and $M1O_mN_n$ comprises $Hf_xO_y$, or $Ta_xO_y$, $Hf_xO_yN_z$, or $Ta_xO_yN_z$, or a combination thereof.

13. The thin film transistor of claim 10, wherein the source electrode and the drain electrode are on a side of the active layer distal to the base substrate.

14. The thin film transistor of claim 10, wherein a projection of the gate electrode on the base substrate substantially overlaps with that of the channel region, the first gate insulating layer, and the second gate insulating layer; and the projection of the gate electrode on the base substrate and those of the channel region, the first gate insulating layer, and the second gate insulating layer are substantially coextensive with each other.

15. The thin film transistor of claim 10, wherein a height of a surface of the second gate insulating layer distal to the base substrate relative to a surface of the base substrate is less than a height of a surface of the source electrode and the drain electrode distal to the base substrate relative to the surface of the base substrate.

16. A display apparatus, comprising the thin film transistor of claim 10.

* * * * *